(12) United States Patent
Nagano

(10) Patent No.: US 10,608,420 B2
(45) Date of Patent: Mar. 31, 2020

(54) HEAT DISPERSION STRUCTURE OF ON-VEHICLE DEVICE

(71) Applicant: Yazaki Corporation, Tokyo (JP)

(72) Inventor: Masayuki Nagano, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/104,721

(22) Filed: Aug. 17, 2018

(65) Prior Publication Data

US 2019/0067921 A1 Feb. 28, 2019

(30) Foreign Application Priority Data

Aug. 30, 2017 (JP) .................. 2017-165367

(51) Int. Cl.
*H02G 3/03* (2006.01)
*H05K 7/20* (2006.01)
(Continued)

(52) U.S. Cl.
CPC ............... *H02G 3/03* (2013.01); *H02G 3/08* (2013.01); *H02G 3/086* (2013.01); *H02G 5/08* (2013.01); *H02G 5/10* (2013.01); *H05K 5/0021* (2013.01); *H05K 5/0065* (2013.01); *H05K 7/20* (2013.01); *H05K 7/209* (2013.01); *H05K 7/2039* (2013.01); *B60R 16/0238* (2013.01); *B60R 16/03* (2013.01); *H05K 5/0073* (2013.01); *H05K 7/20409* (2013.01); *H05K 7/20436* (2013.01); *H05K 7/20854* (2013.01)

(58) Field of Classification Search
CPC ...... G06F 1/20; H05K 7/2039; H05K 1/0209; H05K 7/20; H05K 7/20963; H05K 7/20218; H05K 7/20236; H05K 13/00; H05K 2201/0162; H05K 2201/09909; H05K 7/20772; H05K 7/20509; G02B 6/0073; G02B 6/0085; G02B 6/0068; G02B 6/4269

See application file for complete search history.

(56) References Cited

U.S. PATENT DOCUMENTS

2003/0127821 A1* 7/2003 McCandless .......... B62K 13/06
280/209
2010/0123164 A1* 5/2010 Suehiro .................. F21V 5/043
257/99

(Continued)

FOREIGN PATENT DOCUMENTS

EP 3 288 100 A1 2/2018
GB 2483136 A 2/2012
(Continued)

OTHER PUBLICATIONS

Communication dated Jan. 31, 2019, issued by the United Kingdom in counterpart United Kingdom Application No. 1812771.2.

*Primary Examiner* — Adam B Dravininkas
(74) *Attorney, Agent, or Firm* — Sughrue Mion, PLLC

(57) ABSTRACT

A heat dispersion structure of an on-vehicle device includes a first on-vehicle device including a heat generation source and a first housing which accommodates the heat generation source, and a second on-vehicle device including a second housing having a contact surface to an outer surface of the first housing, and having lower heat generation property than the first on-vehicle device.

10 Claims, 8 Drawing Sheets

(51) Int. Cl.
*H02G 3/08* (2006.01)
*H02G 5/10* (2006.01)
*H02G 5/08* (2006.01)
*H05K 5/00* (2006.01)
B60R 16/023 (2006.01)
B60R 16/03 (2006.01)

(56) References Cited

U.S. PATENT DOCUMENTS

| | | |
|---|---|---|
| 2013/0328466 A1* | 12/2013 | Chang ................ G06F 1/181 |
| | | 312/236 |
| 2015/0163943 A1* | 6/2015 | Kawamura .......... H01H 50/048 |
| | | 361/728 |
| 2015/0257249 A1* | 9/2015 | Kim ................ H05K 1/0204 |
| | | 361/700 |
| 2017/0231104 A1 | 8/2017 | Spaeh |
| 2017/0310065 A1* | 10/2017 | Kawaguchi .......... H05K 5/0021 |

FOREIGN PATENT DOCUMENTS

| | | |
|---|---|---|
| JP | 7-75215 A | 3/1995 |
| JP | 2014-166088 A | 9/2014 |
| JP | 2016-86625 A | 5/2016 |
| WO | 2015/163572 A1 | 10/2015 |
| WO | 2016/048391 A1 | 3/2016 |
| WO | 2016/147619 A1 | 9/2016 |

* cited by examiner

FIG. 7 <Comparative Example> ered to transmit heat from the first housing made of metal to the second housing made of resin via the air layer exclusion section, even when the second housing is made of resin, the area (volume) of the housing is increased with respect to the calorific value per unit, as a result, heat can be dispersed, which can contribute to the prevention of thermal influence.

HEAT DISPERSION STRUCTURE OF ON-VEHICLE DEVICE

CROSS REFERENCE TO RELATED APPLICATIONS

This application claims priority from Japanese Patent Application No. 2017-165367 filed on Aug. 30, 2017, the entire contents of which are incorporated herein by reference.

BACKGROUND OF THE INVENTION

Field of the Invention

The present invention relates to a heat dispersion structure.

Description of Related Art

An on-vehicle electrical junction box disclosed in Japanese Unexamined Patent Publication No. 2014-166088 is configured to include a DC-DC converter circuit board having a relatively large heat generation amount. In the electrical junction box, since the heat generation amount of the DC-DC converter circuit board is large as described above, the DC-DC converter circuit board is accommodated in a metallic shield case and isolated from other circuit boards, and the thermal influence is prevented so that a part of the shield case is exposed from the case upper part of the electrical junction box.
[Patent Document 1] JP-A-2014-166088

According to a related art, since an opening portion is formed in the case upper part of the electrical junction box and a part of the shield case is exposed from this opening portion, there are disadvantages that it as not sufficient for dissipating heat and the structure of the electrical junction box becomes complicated.

SUMMARY

One or more embodiments provide a heat dispersion structure of an on-vehicle device capable of achieving prevention of thermal influences with a simple structure.

In an aspect (1), a heat dispersion structure of an on-vehicle device includes a first on-vehicle device including a heat generation source and a first housing which accommodates the heat generation source, and a second on-vehicle device including a second housing having a contact surface to an outer surface of the first housing, and having lower heat generation property than the first on-vehicle device. The heat dispersion structure of the on-vehicle devices includes an air layer exclusion section which is a combination of the outer surface and the contact surface. The air layer exclusion section and the second housing are heat dispersion sections to the first on-vehicle device.

According to the aspect (1), since the structure is configured to transmit heat generated in the first housing of the first on-vehicle device to the second housing of the second on-vehicle device from the first housing via the air layer exclusion section, a surface area (or a volume) of the housing are expanded with respect to the calorific value per unit, as a result, heat can be dispersed. In addition, according to the present invention, since the structure is configured to bring the contact surface of the second housing into surface contact with the outer surface of the first housing, heat can be dispersed with a simple structure. Therefore, thermal influence can be prevented by dispersion of heat as described above.

In an aspect (2), a concavity and a convexity of the surface and a concavity and a convexity of the contact surface are contact to each other in the air layer exclusion section.

According to the aspect (2), the contact area between the outer surface of the first housing and the contact surface of the second housing can be increased as compared with the case of the contact with only a simple plane. If the contact area can be increased, heat can be easily transmitted to the second housing, as a result, dispersion of heat can be accelerated. According to the present invention, it is possible to contribute to the prevention of thermal influence.

In an aspect (3), a plurality of concavities and convexities of the outer surface and a plurality of concavities and convexities of the contact surface are contact to each other over an entire surface of the outer surface and the contact surface in the air layer exclusion section.

According to the aspect (3), by increasing the number of the concavities and the convexities of the air layer exclusion section, the contact area between the outer surface of the first housing and the contact surface of the second housing can be further increased. According to the present invention, it is possible to further contribute to prevention of thermal influence.

In an aspect (4), the concavity and the convexity of the outer surface and the concavity and the convexity of the contact surface have taper shapes.

According to the aspect (4), is possible to facilitate the contact between the outer surface of the first housing and the contact surface of the second housing.

In an aspect (5), the first housing is made of metal, and the second housing is made of resin.

According to the aspect (5), since the structure is configured to transmit heat from the first housing made of metal to the second housing made of resin via the air layer exclusion section, even when the second housing is made of resin, the area (volume) of the housing is increased with respect to the calorific value per unit, as a result, heat can be dispersed, which can contribute to the prevention of thermal influence.

In an aspect (6), the outer surface is an entire upper surface of the first housing. The contact surface is a lower surface of the second housing which has at least the same size as the entire upper surface.

According to the aspect (6), when heat is generated in the first housing, the entire upper surface of the first housing rises in temperature. Therefore, by adopting the structure which transmits the heat from the entire upper surface of the first housing to the second housing having the lower surface of the same size as the entire upper surface, as a result, the heat can be efficiently dispersed, which can contribute to the prevention of the thermal influence.

In an aspect (7), a portion corresponding to the lower surface of the first housing has a plurality of fins.

According to the aspect (7), the temperature rise of the first on-vehicle device can be suppressed by the plurality of fins of the heat radiation section which is the portion corresponding to the lower surface of the first housing. According to the present invention, it possible to contribute to the prevention of thermal influence.

In an aspect (8), the first on-vehicle device includes one or a plurality of first bus bars which extends from an inside of the first housing to an outside. The second on-vehicle device includes one or a plurality of second bus bars which extends from as inside of the second housing to an outside. A part of an extending part of the first bus bar and a part of an extending part of the second bus bar are contact to each other to form a bus bar contact section.

According to the aspect (8), the temperature rise of the first on-vehicle device can be suppressed by the bus bar drawn out from the inside of the housing (or the temperature rise of the first on-vehicle device and the second on-vehicle device can be suppressed). According to the present invention, it is possible to contribute to the prevention of thermal influence.

According to one or more embodiments, it is possible to achieve the effect that the thermal influence can be prevented with a simple structure.

DETAILED DESCRIPTION

The heat dispersion structure of the on-vehicle device has a structure which transmits heat generated in a first housing of a first on-vehicle device from the first housing to a second housing of a second on-vehicle device via an air layer exclusion section. The air layer exclusion section is formed by a combination of an outer surface of the first housing and a contact surface of the second housing. The air layer exclusion section and the second housing itself are formed as a heat dispersion section for the first on-vehicle device.

Figure 1:
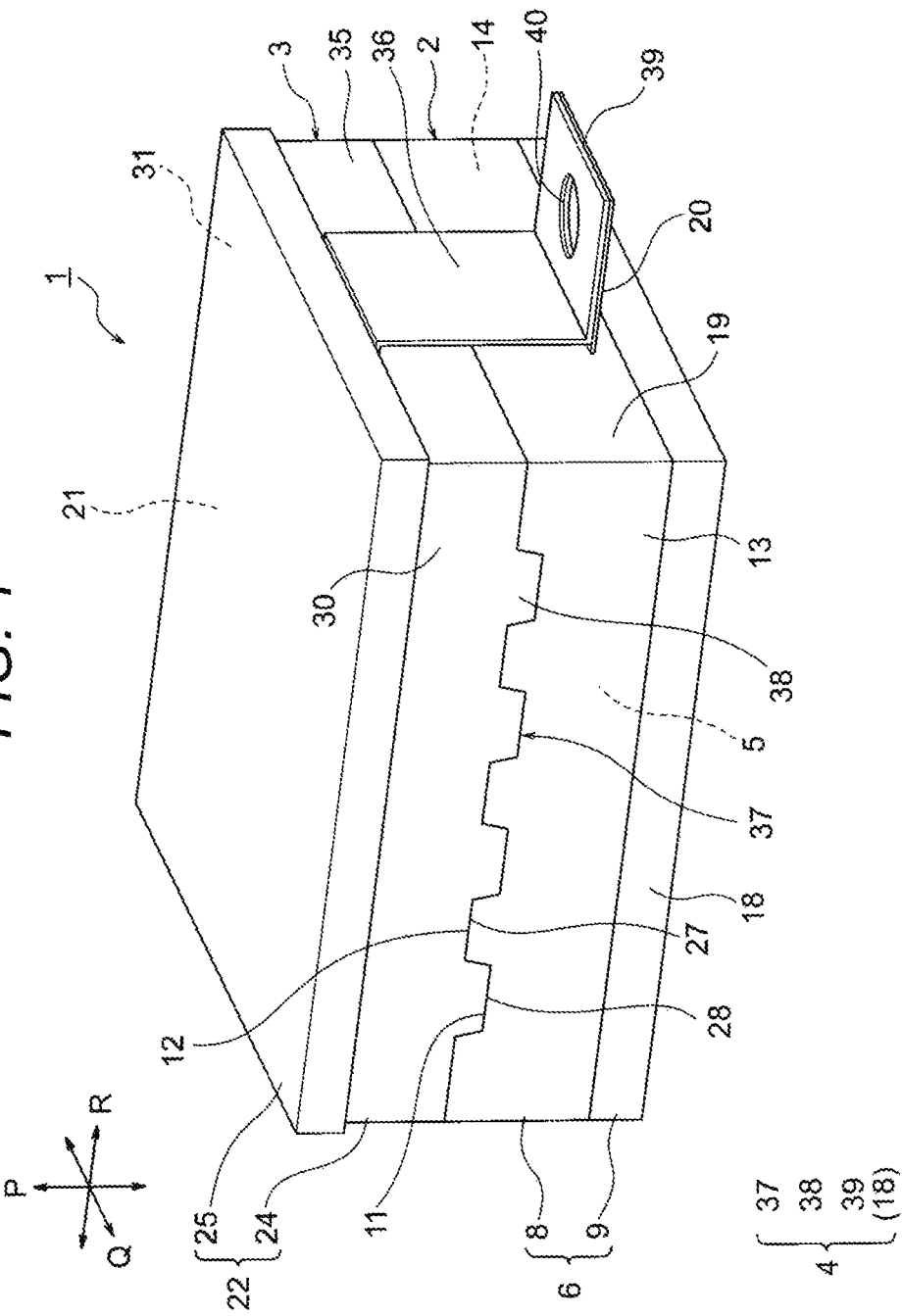
FIG. 1 is a perspective view illustrating an embodiment of an on-vehicle device which adopts a heat dispersion structure.
Figure 2:
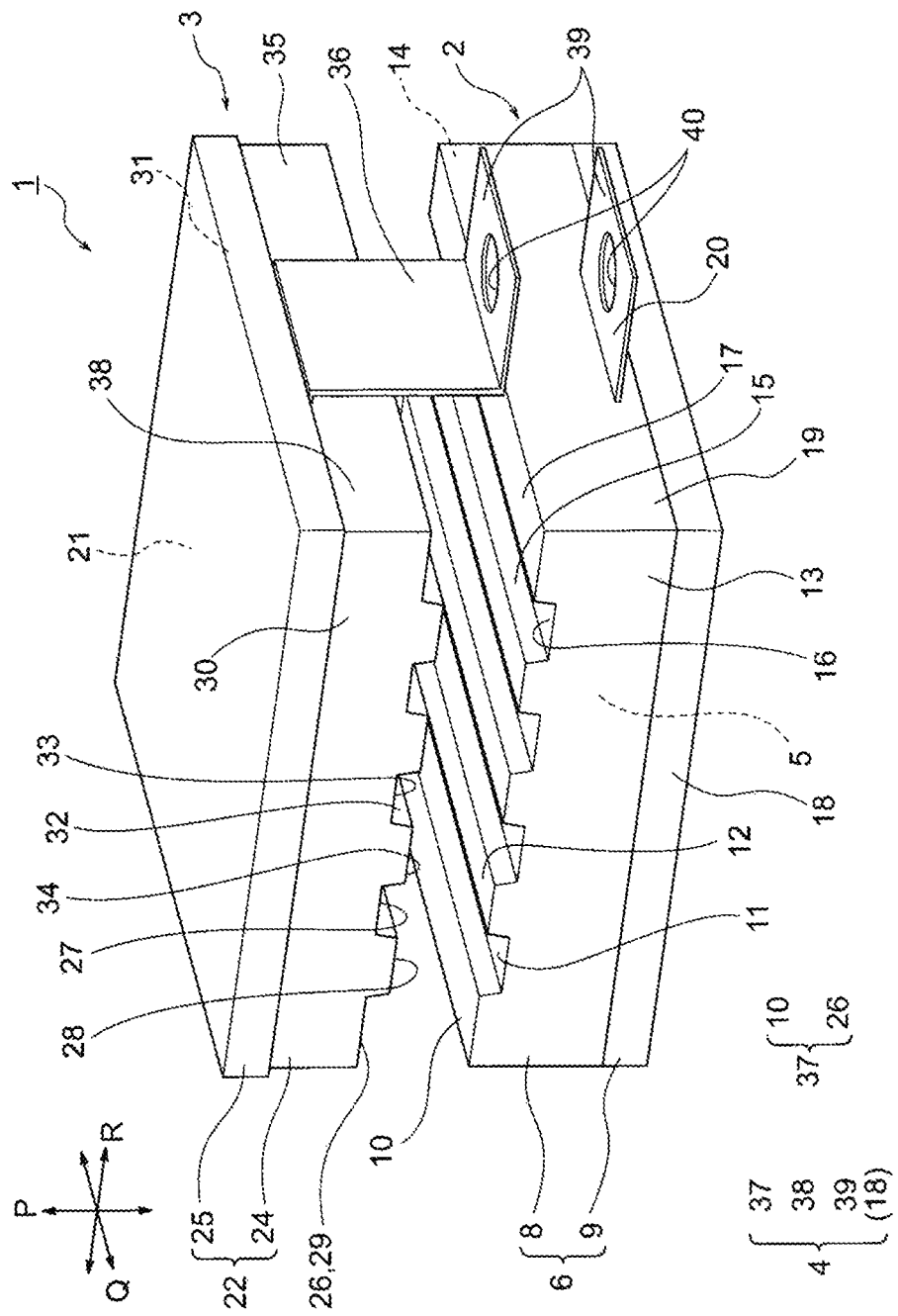
FIG. 2 is an exploded perspective view of the on-vehicle device.
Figure 3:
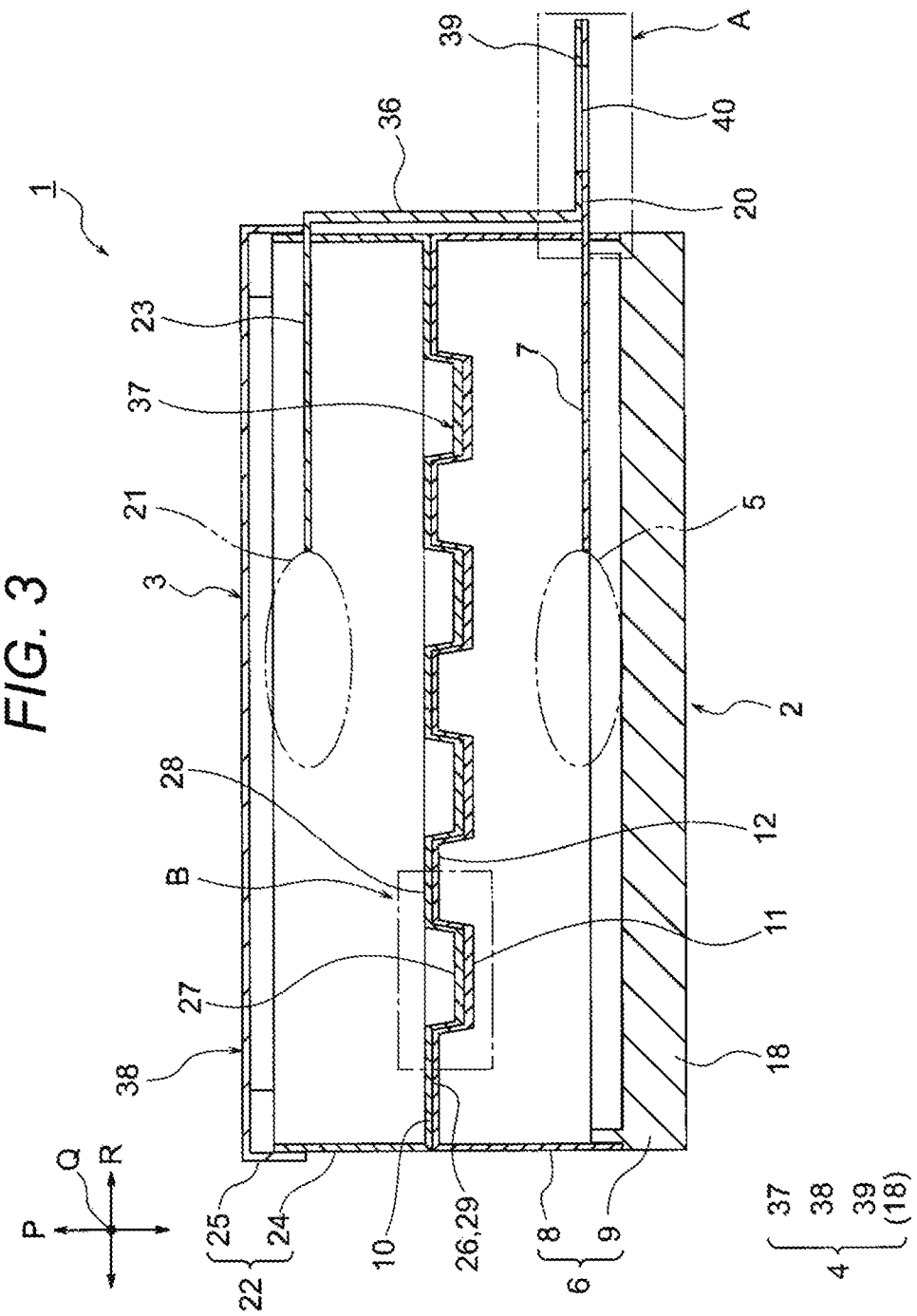
FIG. 3 is a cross-sectional view of the on-vehicle device.
Figure 4A:
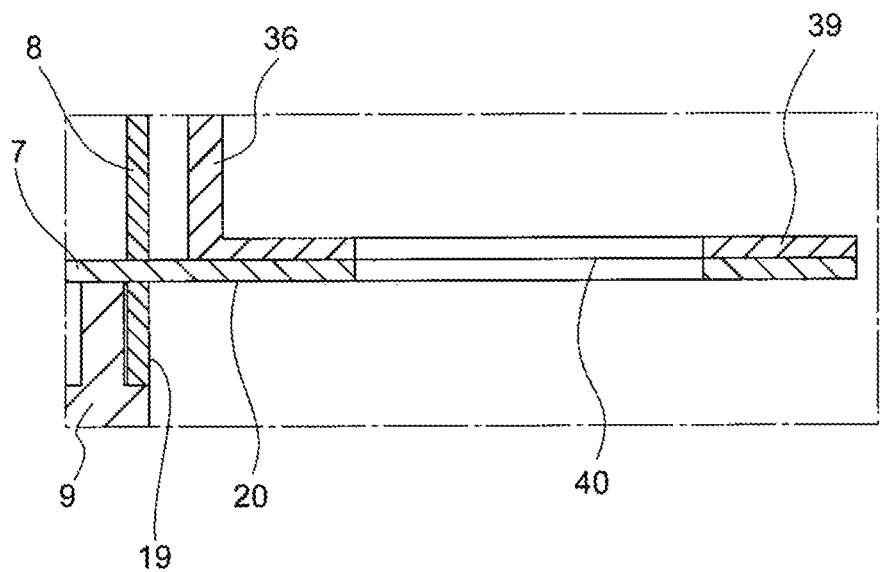
FIGS. 4A and 4B are enlarged views of portions indicated by arrows A and B of FIG. 3.
Figure 4B:
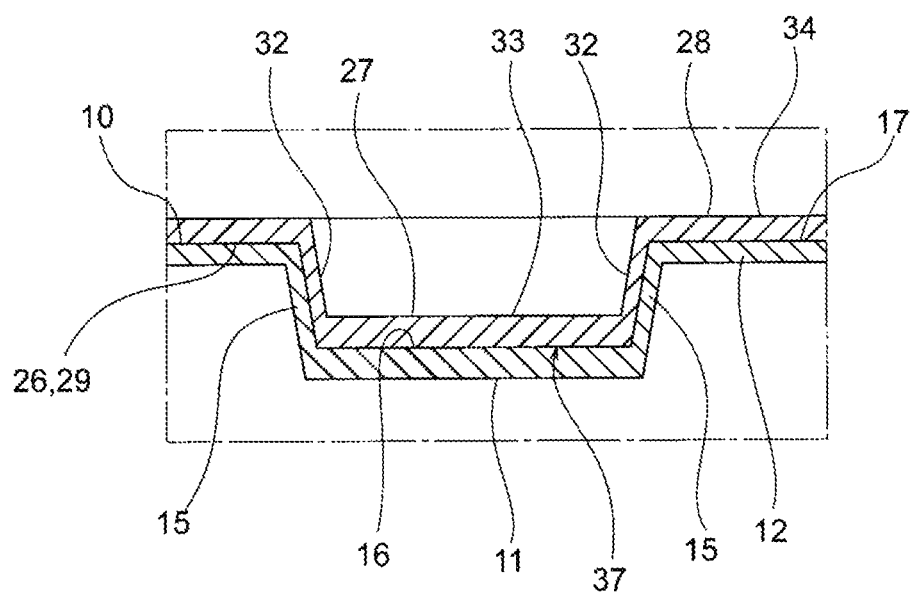
Figure 5:
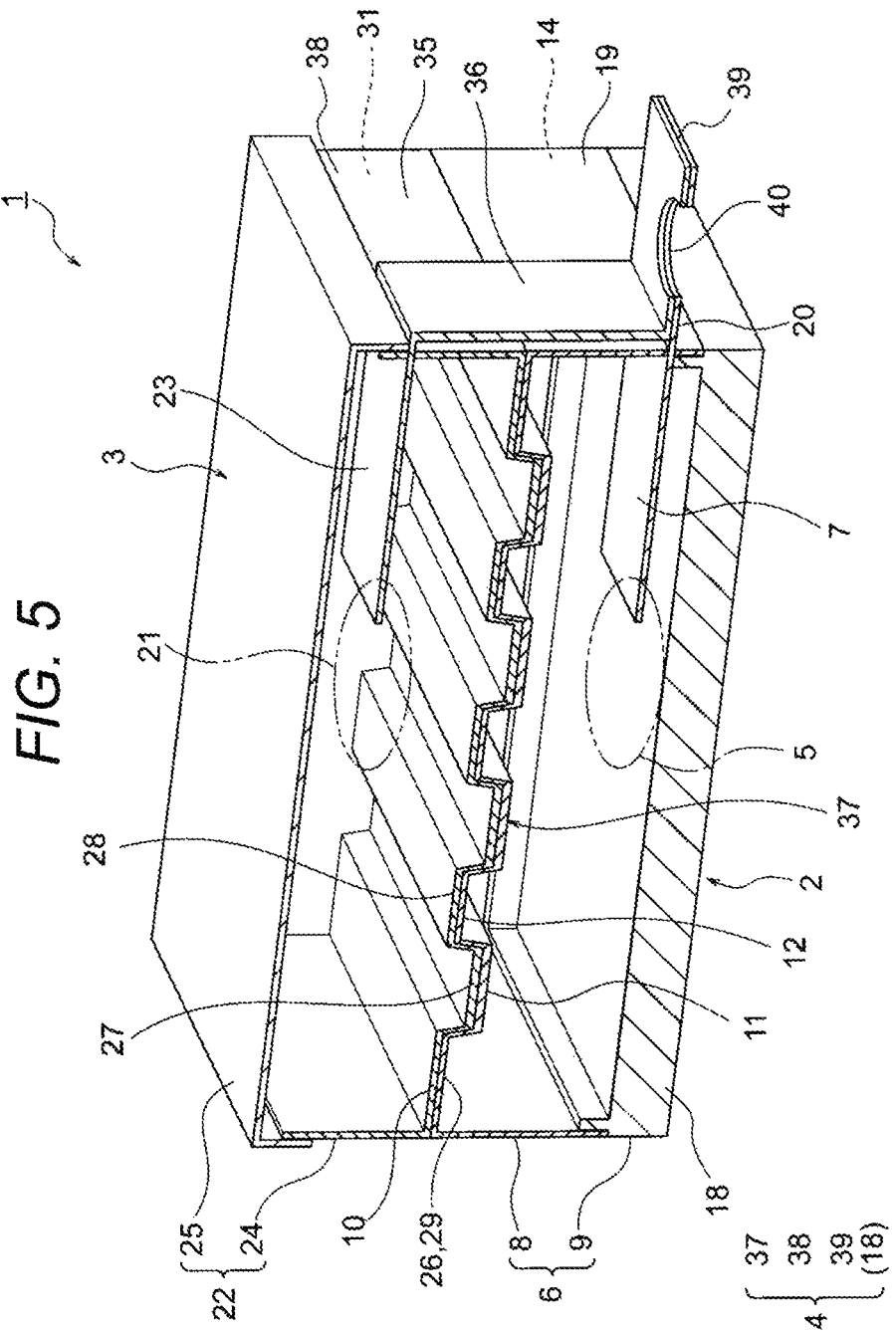
FIG. 5 is a perspective view (including a cross-sectional view) of the on-vehicle device.
Figure 6:
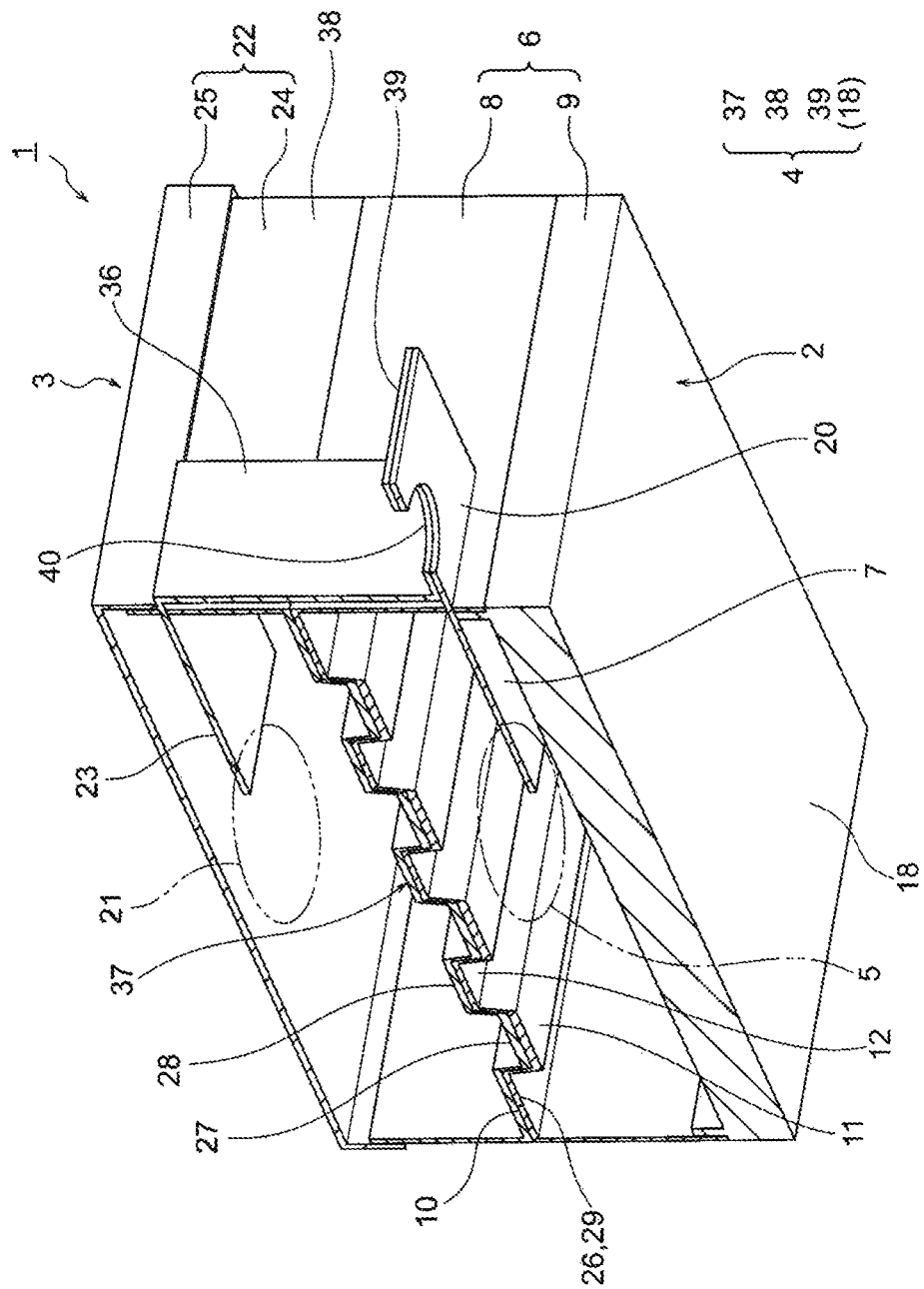
FIG. 6 is a perspective view (including a cross-sectional view) of the on-vehicle device.
Figure 7:
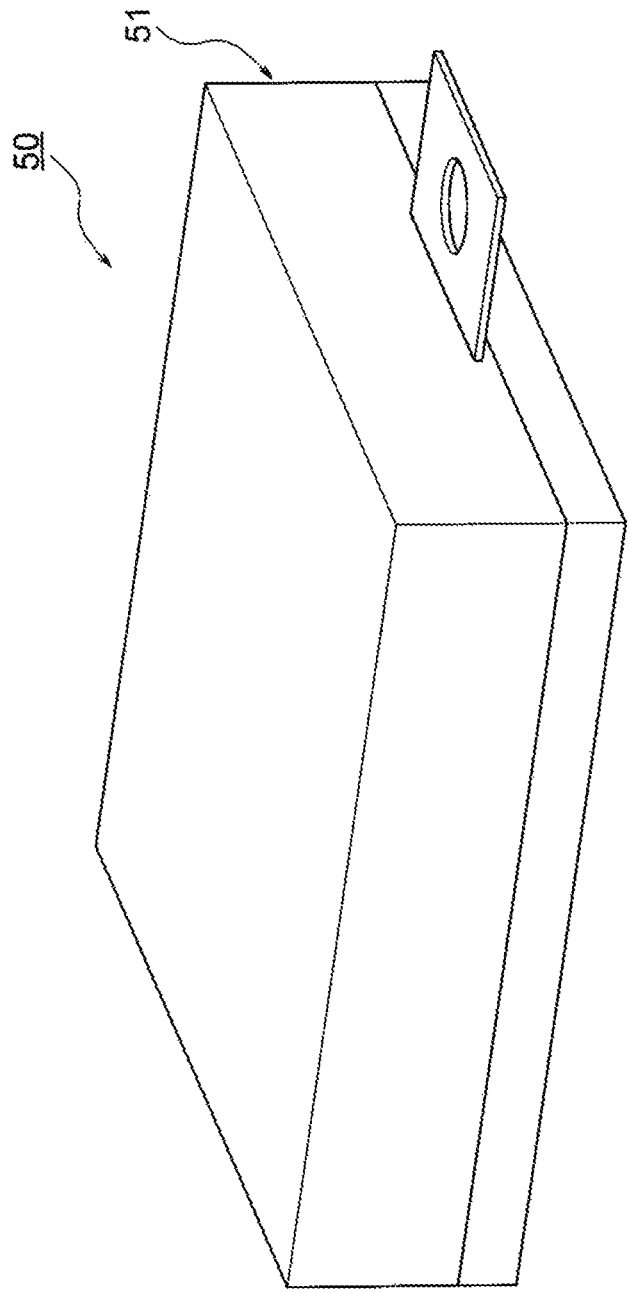
FIG. 7 is a perspective view illustrating a comparative example.
Figure 8:
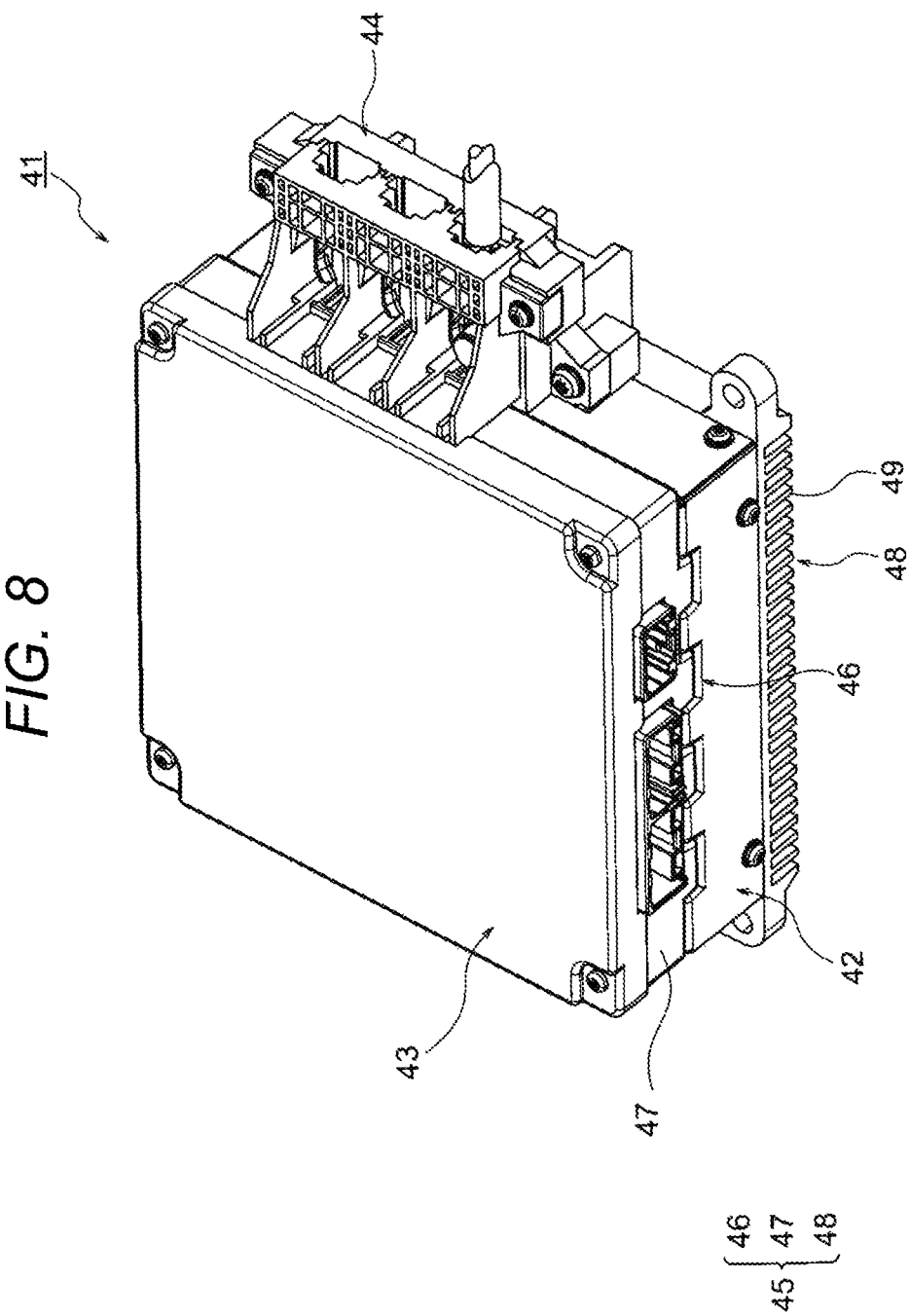
FIG. 8 is a perspective view illustrating a specific example of the on-vehicle device.

Hereinafter, embodiments will be described with reference to the drawings. FIG. 1 is a perspective view illustrating an embodiment of an on-vehicle device which adopts the heat dispersion structure of the present invention. FIG. 2 is an exploded perspective view of the on-vehicle device, FIG. 3 is a cross-sectional view of the on-vehicle device, FIGS. 4A and 4B are enlarged views of portions indicated by arrows A and B of FIG. 3, and FIGS. 5 and 6 are perspective views (including cross-sectional views) of the on-vehicle device, FIG. 7 is a perspective view illustrating a comparative example, and FIG. 8 is a perspective view illustrating a specific example of the on-vehicle device.
<Regarding On-Vehicle Device 1>

In FIG. 1, an on-vehicle device 1 is mounted on an engine room or the like of a vehicle such as an automobile or the like. The on-vehicle device 1 is configured to include a first on-vehicle device 2 having high heat generation property, and a second on-vehicle device 3 having lower heat generation property than that of the first on-vehicle device 2. The on-vehicle device 1 is obtained by placing and integrating the second on-vehicle device 3 on the first on-vehicle device 2. As the first on-vehicle device 2, for example, a DC-DC converter can be adopted. (it is assumed as an example). Further, as the second on-vehicle device 3, an electrical junction box for distributing power or the like can be adopted (it is assumed as an example).

In the on-vehicle device 1, as the first on-vehicle device 2 and the second on-vehicle device 3, those having substantially the same size in plan view adopted. Incidentally, it is assumed that the second on-vehicle device 3 placed on the first on-vehicle device 2 may be larger than the first on-vehicle device 2 (although the second on-vehicle device 3 smaller than the first on-vehicle device 2 is not excluded, the same or larger size would be preferable. Although it will not be described below, even if the second on-vehicle device 3 is somewhat smaller than the first on-vehicle device 2, it is a matter of course that the heat dispersion effect, which will be described later, is obtained)).

In the on-vehicle device 1, a heat dispersion structure 4 is adopted which transmits heat generated in the first on-vehicle device 2 to the second on-vehicle device 3 to disperse the heat. The heat dispersion structure 4 is adopted for the purpose of preventing the thermal influence on the first on-vehicle device 2 with a simple structure (for the purpose of preventing the thermal influence).
<Regarding First On-Vehicle Device 2>

In FIGS. 1 to 3, the first on-vehicle device 2 includes a heat generation source 5, a first housing 6, and a first bus bar 7 it should be noted that the illustration of the fixed part and the like with respect to the vehicle is omitted.

In the drawings, an arrow P represents a vertical direction, an arrow Q represents a left-right direction, and an arrow R represents a front-rear direction. Also, an upward direction of the arrow P is assumed to be the same as the upward flow direction when considering convection of heat.
<Regarding Heat Generation Source 5>

In FIG. 3, although not illustrated in detail, as the heat generation source 5 may be, for example, a known DC-DC converter circuit board (it is assumed as an example, and as long as a generation source of heat in which a comparatively large heat is generated heat and if left unattended, some influence is concerned). The heat generation source 5 is disposed in a part of the first housing 6 or entirely. The heat generation source 5 is disposed in such a state such as being placed on the heat radiation section 18 to be described later of the first housing 6. A part of the first bus bar 7 is connected to the heat generation source 5.
<Regarding First Housing 6>

In FIGS. 1 to 3, the first housing 6 is a metallic rectangular housing, and is formed to have a size capable of accommodating the heat generation source 5 therein. In the present embodiment, the first housing 6 is configured to include an upper case 8 and a lower cover 9.

The upper case 8 is formed in a shape in which the lower side is open. A plurality of concave portions 11 and convex portions 12 are formed on the entire upper surface 10 of the upper case 8. That is, the entire upper surface 10 is formed in a concavo-convex shape. It should be noted that the upper surface 10 corresponds to an "outer surface" in the claims. The concave portion 11 and the convex portion 12 are formed in a shape extending in the left-right direction of the arrow Q. A left surface 13 and a right surface 14 of the upper case 8 are formed such that a boundary with the upper surface 10 has a concavo-convex shape because of the presence of the concave portion 11 and the convex portion 12. A taper 15 and a bottom 16 or a ceiling 17 are formed in the concave portion 11 and the convex portion 12 (see FIG. 4E). The taper 15 is formed at an appropriate angle in consideration of ease of contact with the contact surface 29 to be described later and the like. It is a matter of course that the formation of the concave portion 11 and the convex portion 12 contributes to ensuring positioning and stability when placing the second on-vehicle device 3 on the first on-vehicle device 2.

Regarding the shapes of the concave portion 11 and the convex portion 12, it is assumed that it is not a portion in which a rib is erected on a plane. The concave portion 11 and the convex portion 12 are formed in such a portion as to ensure a contact area with the second housing 22 as much as possible. In addition, the concave portion 11 and the convex portion 12 are formed in a shape that makes it easy to place the second housing 22. The concave portion 11 and the convex portion 12 are formed in such a shape in which an air layer exclusion section 37 to be described later is generated.

It is assumed that the concave portion 11 and the convex portion 12 do not have a concavo-convex shape like a fin 49 described later with reference to FIG. 8. Also, it does not have a concavo-convex shape for the purpose of locking. It should be noted that the points relating to the shapes of the concave portion 11 and the convex portion 12 as described above are also applied to a concave portion 27 and a convex portion 28 to be described later of the second housing 22.

The lower cover 9 is formed in a portion in which the upper side is covered with the upper case 8. The lower cover 9 is formed as a heat radiation section 18 having a plurality of fins (fins 49 described later with reference to FIG. 8) which is a portion corresponding to the lower surface of the first housing 6.

The entire outer side of the lower cover 9 is the heat radiation section 18 and is formed in a portion in which it can be exposed to emit heat exposed to the air. Inside the lower cover 9 (above the heat radiation section 18), the heat generation source 5 is placed as described above.

<Regarding First Bus Bar 7>

In FIGS. 1 to 6, the first bus bar 7 is a metallic band plate having conductivity and is used as a part of a circuit. The first bus bar 7 is formed so as to be drawn from the inside of the first housing 6 to the outside through the front surface 19 (the insulation structure with the front surface 19 is omitted here). The reference numeral 20 in such a first bus bar 7 indicates an external drawing section. The external drawing section 20 is formed as a bus bar terminal portion for performing the electrical connection with the outside. Although the number of the first bus bars 7 is one in the present embodiment, it may be plural. The first bus bar 7 is also formed as a portion for pulling the heat generated in the first housing 6 to the outside.

<Regarding Second On-Vehicle Device 3>

In FIGS. 1 to 3, the second on-vehicle device 3 is configured to include an accommodating member 21, a second housing 22, and a second bus bar 23. The second on-vehicle device 3 becomes a device having such a structure that it is placed on the first on-vehicle device 2 and integrated.

<Regarding Accommodating Member 21>

In FIG. 3, a detailed illustration is omitted, but a power distribution circuit board of an electrical junction box can be adopted as an example of the accommodating member (it is assumed as an example, and the accommodating member 21 is a circuit board or the like accommodated in the second housing 22). A part of the second bus bar 23 is connected to the accommodating member 21.

<Regarding Second Housing 22>

In FIGS. 1 to 3, the second housing 22 is rectangular housing made of resin and formed to have a size capable of accommodating the accommodating member 21 therein. In the present embodiment, the second housing 22 is configured to include a lower case 24 and an upper cover 25.

The lower case 24 is formed in a shape in which the upper side is open. A plurality of concave portions 27 and convex portions 28 are formed on the entire lower surface 26 of the lower case 24. That is, the entire lower surface 26 is formed in a concavo-convex shape. It should be noted that the lower surface 26 corresponds to the "contact surface" in the claims (the reference sign is 29). The concave portion 27 and the convex portion 28 are formed in a shape extending in the left-right direction of the arrow Q. The left surface 30 and the right surface 31 of the lower case 24 are formed such that the boundary with the lower surface 26 has a concavo-convex shape because of the presence of the concave portion 27 and the convex portion 28.

The concave portion 27 and the convex portion 28 rest on the convex portion 12 and the concave portion 11 of the first housing 6, and are formed such that the tapers 32 and 15 make surface contact with each other, the bottom 33 and the ceiling 17 make surface contact with each other, and the ceiling 34 and the bottom 16 make surface contact with each other.

The upper cover 25 is formed in a portion which covers the upper side of the lower case 24. The upper cover 25 is formed in a lid-like portion.

<Regarding Second Bus Bar 23>

In FIGS. 1 to 6, the second bus bar 23 is a metallic band plate having conductivity and is used as a part of a circuit in the present embodiment. The second bus bar 23 is formed such that it is possible to be drawn from the inside of the second housing 22 to the outside via the front surface 35. Reference numeral 36 in such a second bus bar 23 indicates an external drawing section. The external drawing section 36 is formed as a bus bar terminal portion for performing the electrical connection with the outside. The external drawing section 36 is formed in an L-shaped portion. The external drawing section 36 formed in such a shape in which leading end thereof comes into contact with the external drawing section 20 of the first bus bar 7. Although the number of the first bus bars 7 is one in the present embodiment, it may be plural. The second bus bar 23 is provided in accordance with the number of the first bus bars 7 in the present embodiment.

<Regarding Heat Dispersion Structure 4>

In FIGS. 1 to 6, the heat dispersion structure 4 is configured to include an air layer exclusion section 37, a heat dispersion section 38, and a bus bar contact section 39. In addition, the heat dispersion structure 4 is configured to also include the heat radiation section 18 in the present embodiment (it is optional to include the heat radiation section 18, which is indicated by parentheses in the drawings). The heat dispersion structure 4 is adopted for the purpose of preventing thermal influence as described above.

<Regarding Air Layer Exclusion Section 37>

In FIGS. 1 to 6, the air layer exclusion section 37 is formed by a combination of the entire upper surface 10 of the first housing 6 and the contact surface 29 of the second housing 22. The air layer exclusion section 37 is formed as a part such that the entire upper surface 10 and the contact surface 29 are in surface contact with each other to positively prevent the air layer from being present therebetween. The reason for preventing the air layer from being present is to smoothly transmit the heat from the from housing 6 to the second housing 22.

<Regarding Heat Dispersion Section 38>

In FIGS. 1 to 6, the heat dispersion section 38 corresponds to a part that points to the air layer exclusion section 37 and the second housing 22 itself. In other words, the heat dispersion section 38 corresponds to the part related to dispersion of heat transmitted from the first housing 6 on the first housing 6. As can be seen from the drawings, since the heat dispersion section 38 can ensure a sufficient surface area (and volume), it is a matter of course that the effect on dispersion of heat is naturally increased.

<Regarding Bus Bar Contact Section 39>

In FIGS. 1 to 6, the bus bar contact section 39 is used to transmit the heat generated in the first housing 6 of the first on-vehicle device 2 in the sequence of the first bus bar 7→the external drawing section 20→the external drawing section 36→the second bus bar 23, thereby achieving dispersion of heat on the side of the second on-vehicle device 3 (it is assumed to be used to draw the heat raised on the side of the second on-vehicle device 3 by the heat dispersion section 38 to the outside from the second bus bar 23). The bus bar contact section 39 is formed by the surface contact between the leading end portion of the external drawing section 20 of the first bus bar 7 and the leading end portion of the external drawing section 36 of the second bus bar 23. An insertion hole 40 for a bolt (not illustrated) used for connection with an external terminal (not illustrated) is circularly formed in the bus bar contact section 39 to penetrate therethough.

<Regarding Operational Effects of Heat Dispersion Structure 4>

As described above with reference to FIGS. 1 to 6, according to the heat dispersion structure 4 of the on-vehicle device 1 which is an embodiment of the present invention, heat generated in the first housing 6 of the first on-vehicle device 2 can be transmitted to the second housing 22 of the second on-vehicle device 3 from the first housing 6 via the air layer exclusion section 37. With such a structure for transmitting heat, the surface area and volume of the housing are expanded with respect to the calorific value per unit, as a result, heat can be dispersed (as compared to the on-vehicle device 50 alone of FIG. 7 which is a comparative example, the difference in surface area is clearly understood. Further, in the comparative example, since the first housing 51 is simply exposed to air, the dispersion destination of the heat becomes air).

In addition, according to the heat dispersion structure 4, since the structure is configured to bring the contact surface 29 of the second housing 22 into surface contact with the entire upper surface 10 of the first housing 6, heat can be dispersed with a simple structure.

Accordingly, it is possible to achieve the effect that thermal influence can be prevented by dispersion of heat as described above.

<Regarding On-Vehicle Device 41 as Specific Example>

In FIG. 8, the on-vehicle device 41 is configured to include a DC-DC converter 42, an electrical junction box 43 placed on and integrated with the DC-DC converter 42, and a bus bar block 44 provided with a bus bar connecting section (not illustrated). In the on-vehicle device 41, a heat dispersion structure 45 is adopted, which transmits heat generated in the DC-DC converter 42 to the electrical junction box 43 to disperse the heat. The heat dispersion structure 45 is configured to include an air layer exclusion section 46, a heat dispersion section 47, a bus bar contact section (not illustrated), and a heat radiation section 48. A plurality of fins 49 is formed in the heat radiation section 48.

In the heat dispersion structure 45 of the on-vehicle device 41 as described above, it is also possible to exhibit an effect capable of preventing the thermal influence by dispersion of heat as described above.

It is a matter of course that the present invention can be variously modified within a scope that does not change the gist of the present invention.

1: on-vehicle device
2: first on-vehicle device
3: second on-vehicle device
4: heat dispersion structure
5: heat generation source
6: first housing
7: first bus bar
8: upper case
9: lower cover
10: upper surface
11: concave portion
12: convex portion
13: left surface
14: right surface
15: taper
16: bottom
17: ceiling
18: heat radiation section
19: front surface
20: external drawing section
21: accommodating member
22: second housing
23: second bus bar
24: lower case
25: upper cover
26: lower surface
27: concave portion
28: convey portion
29: contact surface
30: left surface
31: right surface
32: taper
33: bottom
34: ceiling
35: front surface
36: external drawing section.
37: air layer exclusion section
38: heat dispersion section
39: bus bar contact section
40: insertion hole
41: on-vehicle device
42: DC-DC converter
43: electrical junction box
44: bus bar block
45: heat dispersion structure
46: air layer exclusion section
47: heat dispersion section
48: heat radiation section
49: fin
50: first on-vehicle device
51: first housing

What is claimed is:

1. A heat dispersion structure of an on-vehicle device comprising:
    a first on-vehicle device including a heat generation source and a first housing which accommodates the heat generation source; and
    a second on-vehicle device including a second housing having a contact surface to an outer surface of the first housing, and having lower heat generation property than the first on-vehicle device, wherein the heat dispersion structure of the on-vehicle devices includes an air layer exclusion section which is a combination of the outer surface and the contact surface, wherein the air layer exclusion section and the second housing are heat dispersion sections to the first on-vehicle device, wherein the second housing of the second on-vehicle device is configured to house at least one circuit, and wherein the first housing is made of metal, and the second housing is made of resin.

2. The heat dispersion structure of the on-vehicle device according to claim 1,
wherein a concavity and a convexity of the outer surface and a concavity and a convexity of the contact surface are in contact with each other in the air layer exclusion section.

3. The heat dispersion structure of the on-vehicle device according to claim 2,
wherein a plurality of concavities and convexities of the outer surface and a plurality of concavities and convexities of the contact surface are in contact with each other over an entire surface of the outer surface and the contact surface in the air layer exclusion section.

4. The heat dispersion structure of the on-vehicle device according to claim 2,
wherein the concavity and the convexity of the outer surface and the concavity and the convexity of the contact surface have taper shapes.

5. The heat dispersion structure of the on-vehicle device according to claim 1,
wherein the outer surface is an entire upper surface of the first housing, and
wherein the contact surface is a lower surface of the second housing which has a size that is greater than or equal to a size of the entire upper surface.

6. The heat dispersion structure of the on-vehicle device according to claim 5,
wherein a portion corresponding to the lower surface of the first housing has a plurality of fins.

7. The heat dispersion structure of the on-vehicle device according to claim 1,
wherein the second on-vehicle device is an electrical junction box configured to distribute power.

8. The heat dispersion structure of the on-vehicle device according to claim 1,
wherein the first housing, of the first on-vehicle device, comprises a first case that houses the heat generation source,
wherein the second housing, of the second on-vehicle device, comprises a second case, and
wherein the first housing and the second housing are outside of each other.

9. A heat dispersion structure of an on-vehicle device comprising:
a first on-vehicle device including a heat generation source and a first housing which accommodates the heat generation source; and
a second on-vehicle device including a second housing having a contact surface to an outer surface of the first housing, and having lower heat generation property than the first on-vehicle device,
wherein the heat dispersion structure of the on-vehicle devices includes an air layer exclusion section which is a combination of the outer surface and the contact surface,
wherein the air layer exclusion section and the second housing are heat dispersion sections to the first on-vehicle device, and
wherein the first housing is made of metal, and the second housing is made of resin.

10. A heat dispersion structure of an on-vehicle device comprising:
a first on-vehicle device including a heat generation source and a first housing which accommodates the heat generation source; and
a second on-vehicle device including a second housing having a contact surface to an outer surface of the first housing, and having lower heat generation property than the first on-vehicle device,
wherein the heat dispersion structure of the on-vehicle devices includes an air layer exclusion section which is a combination of the outer surface and the contact surface,
wherein the air layer exclusion section and the second housing are heat dispersion sections to the first on-vehicle device,
wherein the first on-vehicle device includes a first bus bar which extends from an inside of the first housing to an outside of the first housing,
wherein the second on-vehicle device includes a second bus bar which extends from an inside of the second housing to an outside of the second housing, and
wherein a part of an extending part of the first bus bar and a part of an extending part of the second bus bar are in contact with each other to form a bus bar contact section.

* * * * *